United States Patent
Meguro et al.

(10) Patent No.: US 8,779,764 B2
(45) Date of Patent: Jul. 15, 2014

(54) METHOD FOR PRODUCING MAGNETORESISTIVE EFFECT ELEMENT, MAGNETIC SENSOR, ROTATION-ANGLE DETECTION DEVICE

(75) Inventors: Kenichi Meguro, Kaisei (JP); Hiroyuki Hoshiya, Odawara (JP); Keizou Katou, Hachiouji (JP); Yasunori Abe, Nagaokakyo (JP)

(73) Assignee: Hitachi Metals, Ltd., Tokyo (JP)

( * ) Notice: Subject to any disclaimer, the term of this patent is extended or adjusted under 35 U.S.C. 154(b) by 362 days.

(21) Appl. No.: 13/321,896

(22) PCT Filed: Jul. 13, 2010

(86) PCT No.: PCT/JP2010/061806
§ 371 (c)(1),
(2), (4) Date: Jan. 13, 2012

(87) PCT Pub. No.: WO2011/007767
PCT Pub. Date: Jan. 20, 2011

(65) Prior Publication Data
US 2012/0112741 A1 May 10, 2012

(30) Foreign Application Priority Data
Jul. 13, 2009 (JP) .................. 2009-164964

(51) Int. Cl.
*G01R 33/02* (2006.01)
(52) U.S. Cl.
USPC ...... 324/252; 324/247; 324/249; 324/207.21; 324/207.25; 702/145; 702/147; 702/151; 702/163; 73/862.331; 73/862.326; 73/117.02

(58) Field of Classification Search
USPC .................................................. 324/207.25
See application file for complete search history.

(56) References Cited

U.S. PATENT DOCUMENTS

| 4,604,176 | A | 8/1986 | Paul |
| 5,583,725 | A | 12/1996 | Coffey et al. |
| 7,164,560 | B2 | 1/2007 | Saito et al. |
| 7,323,870 | B2 * | 1/2008 | Tatschl et al. ................. 324/252 |
| 7,564,659 | B2 | 7/2009 | Freitag et al. |

(Continued)

FOREIGN PATENT DOCUMENTS

| DE | 10 2005 037 036 B4 | 7/2007 |
| DE | 699 32 800 T2 | 8/2007 |

(Continued)

OTHER PUBLICATIONS

German Office Action (and English Translation) dated Jun. 21, 2013 in co-pending German Patent Application No. 112010002899.0.

(Continued)

*Primary Examiner* — Tung X Nguyen
*Assistant Examiner* — Thang Le
(74) *Attorney, Agent, or Firm* — Volpe and Koenig, P.C.

(57) ABSTRACT

To provide a method which can define the direction and orientation of magnetization of a pinned layer while reducing the number of steps of forming a GMR film. The magnetization direction of the pinned layer is defined in a plurality of directions by forming a plurality of patterns having directivities. Further, when the magneto-resistive effect film is formed, a magnetic field is applied in a direction at an angle set between the angles of the plurality of patterns.

9 Claims, 9 Drawing Sheets

(56) References Cited

U.S. PATENT DOCUMENTS

| | | | |
|---|---|---|---|
| 8,063,633 B2* | 11/2011 | Raberg et al. | 324/252 |
| 2001/0020847 A1 | 9/2001 | Mattheis et al. | |
| 2003/0070497 A1* | 4/2003 | Kikuchi et al. | 73/862.333 |
| 2006/0110629 A1 | 5/2006 | Sato | |
| 2007/0109692 A1 | 5/2007 | Carey et al. | |
| 2007/0133251 A1 | 6/2007 | Carey et al. | |
| 2008/0116886 A1* | 5/2008 | Yamada et al. | 324/207.21 |
| 2008/0169807 A1* | 7/2008 | Naito et al. | 324/252 |
| 2008/0204945 A1 | 8/2008 | Freitag et al. | |
| 2009/0027048 A1* | 1/2009 | Sato et al. | 324/247 |
| 2009/0087589 A1 | 4/2009 | Guo et al. | |
| 2009/0154025 A1 | 6/2009 | Carey et al. | |
| 2009/0189601 A1* | 7/2009 | Okada et al. | 324/207.21 |
| 2011/0163739 A1* | 7/2011 | Ono et al. | 324/207.21 |

FOREIGN PATENT DOCUMENTS

| | | | |
|---|---|---|---|
| EP | 1 659 575 A1 | 5/2006 | |
| GB | 2 360 875 A | 10/2001 | |
| JP | 3033934 B2 | 2/2000 | |
| JP | 3040750 B2 | 3/2000 | |
| JP | 2002-519873 A | 7/2002 | |
| JP | 2003-502876 A | 1/2003 | |
| JP | 2006-172686 A | 6/2006 | |
| JP | 2006-308573 A | 11/2006 | |
| JP | 2007-142393 A | 6/2007 | |
| JP | 2007-317734 A | 6/2007 | |
| JP | 2008-306112 A | 12/2008 | |
| JP | 2009-085953 A | 4/2009 | |
| WO | 00/10024 A | 2/2000 | |
| WO | 00/79298 A2 | 12/2000 | |
| WO | 2006/098431 A1 | 9/2006 | |

OTHER PUBLICATIONS

Japanese Office Action (and English Translation) dated Sep. 10, 2013 in co-pending Japanese Patent Application No. 2011-522809.
International Search Report with Written Opinion(Japanese) from PCT/JP2010/061806, filed Jul. 13, 2010.

* cited by examiner

Figure 2
(a)
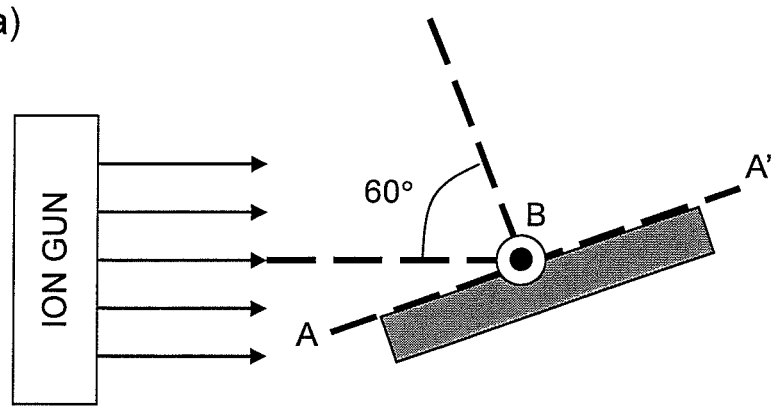
(b)
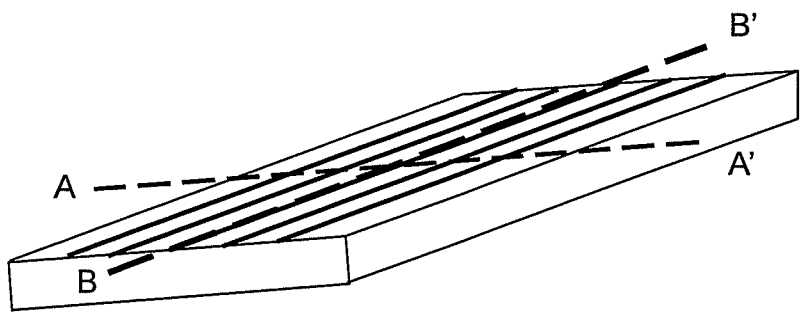

Figure 3
(a) A-A' cross section
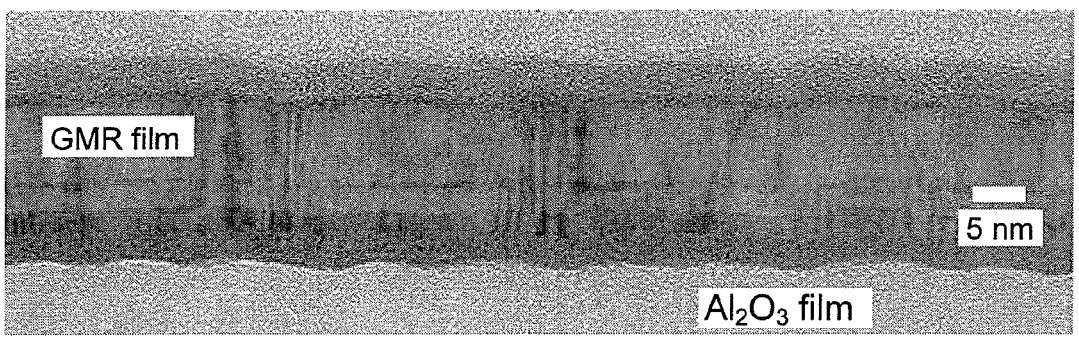
(b) Cross section in the direction perpendicular to paper surface (B-B')
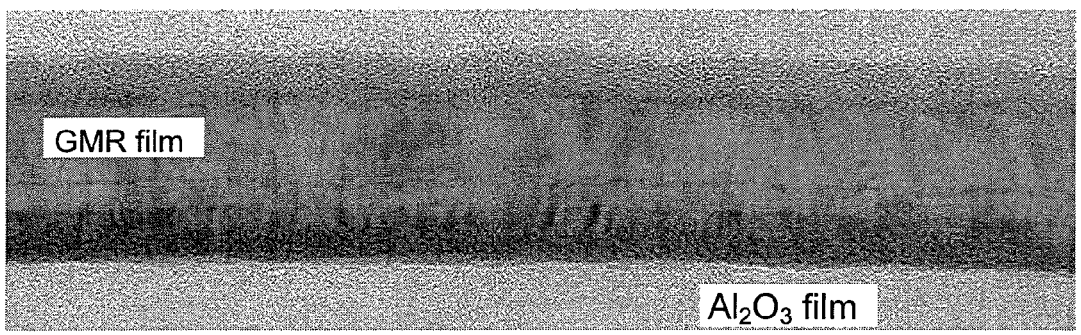
Figure 4
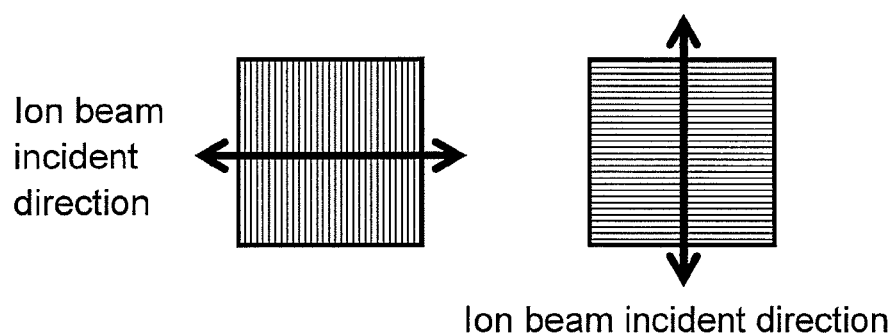

Figure 5
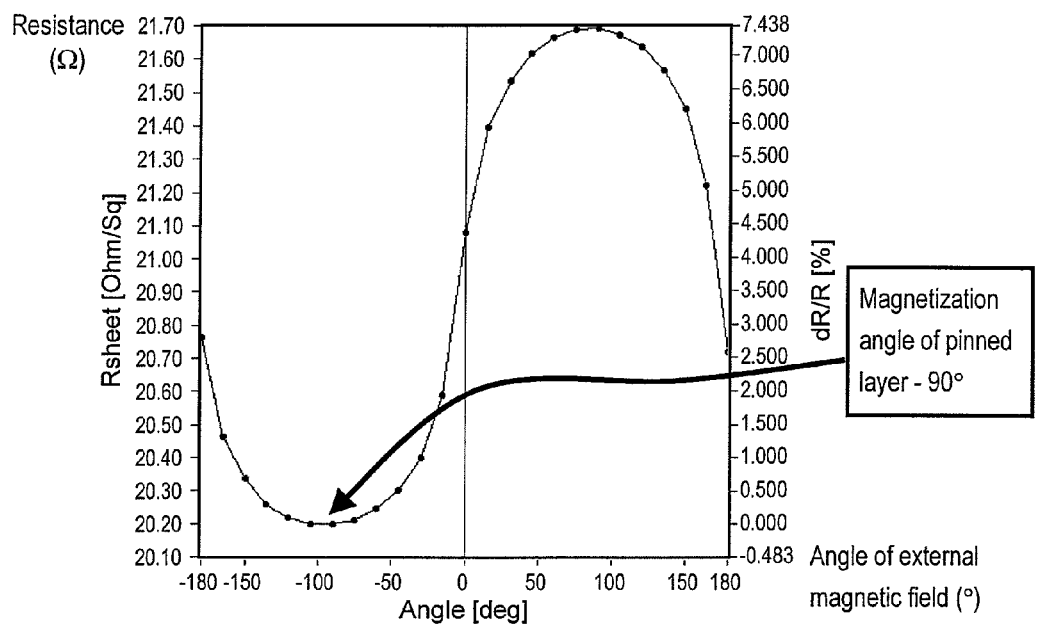
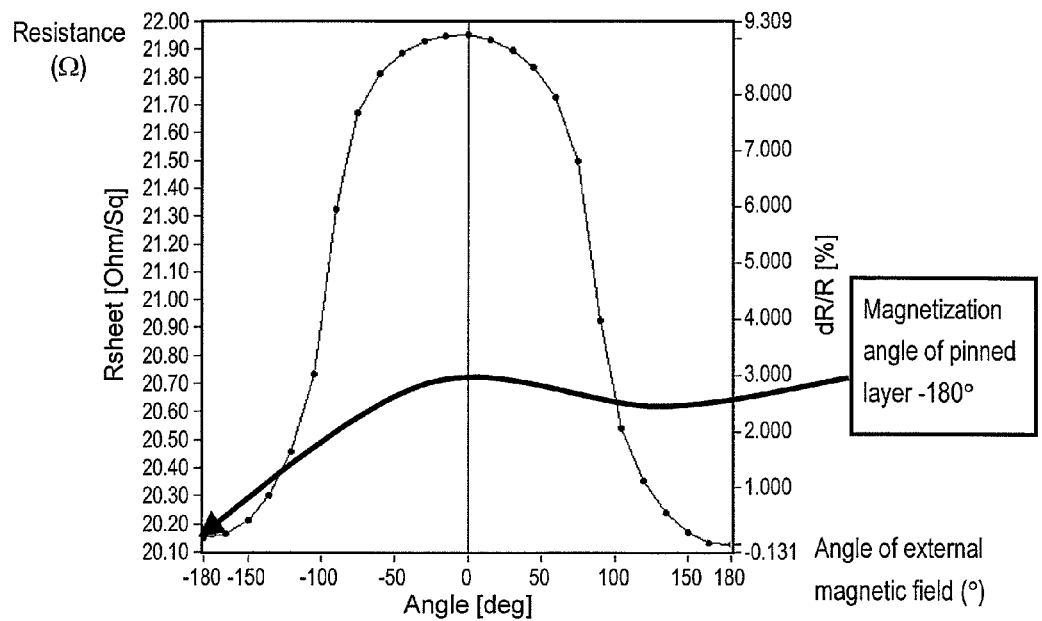

Figure 6
(1) Formation of texture (0°, 90°)
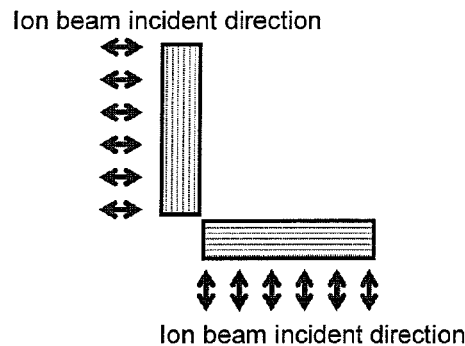
(4) Formation of texture (180°, 270°)
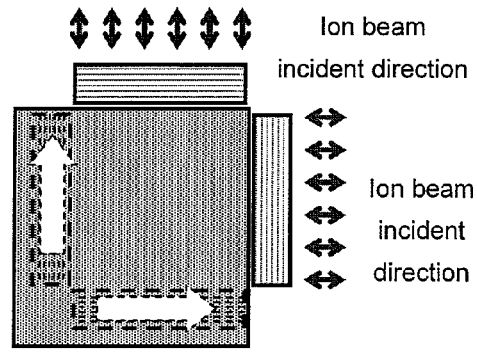
(2) Formation of GMR film (θ=45°)
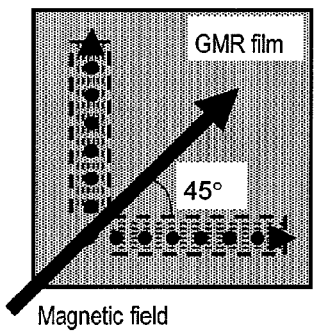
(5) Formation of GMR film (θ=225°)
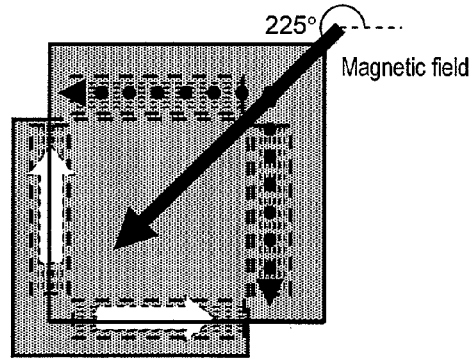
(3) Formation of element
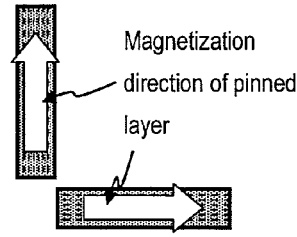
(6) Formation of element
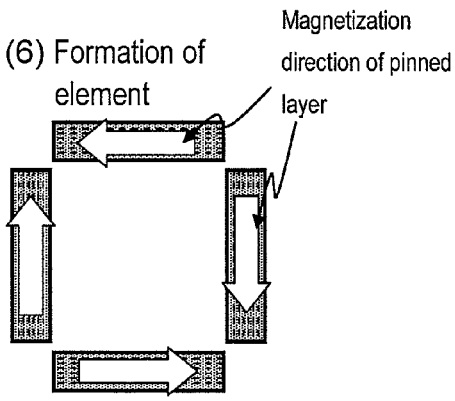

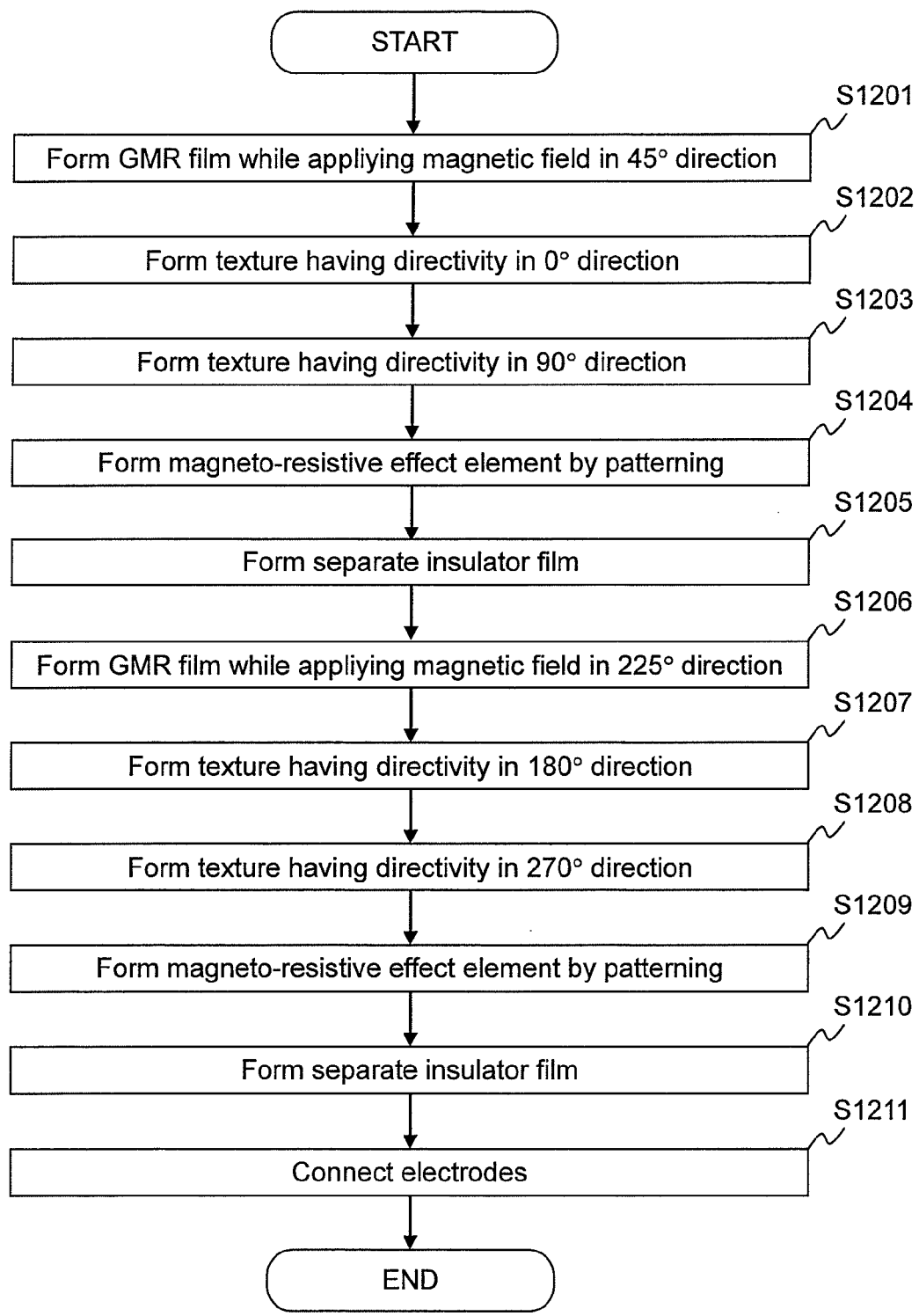

METHOD FOR PRODUCING MAGNETORESISTIVE EFFECT ELEMENT, MAGNETIC SENSOR, ROTATION-ANGLE DETECTION DEVICE

TECHNICAL FIELD

The present invention relates to a method for producing a magneto-resistive effect element, to a magnetic sensor using the magneto-resistive effect element, and to a rotation-angle detection device using the magnetic sensor.

BACKGROUND ART

A magnetic sensor using a magneto-resistive effect element can detect, in a non-contact manner, displacement of a detection object provided with a magnetic field generation mechanism, and is used as a magnetic encoder and a magnetic rotation-angle detection sensor. Among magneto-resistive effect elements, a magneto-resistive effect element, using a giant magneto-resistive effect (hereinafter described as GMR) film and referred to as Spin-Valve (hereinafter described as SV) type, is useful for the detection of rotation angle.

As described in Patent Literature 1, an SV type GMR film has a basic structure formed of an antiferromagnetic layer/a pinned layer/a nonmagnetic layer/a free layer. The pinned layer is exchange-coupled to the antiferromagnetic layer formed adjacently to the pinned layer, so that the magnetization direction of the pinned layer is fixed to one direction. On the other hand, the magnetization direction of the free layer is changed according to an external magnetic field.

Therefore, when a rotating magnetic field signal having a comparatively small intensity is applied to the SV type GMR film, the relative angle between the magnetization of the pinned layer and the magnetization of the free layer is changed, so that an electric output corresponding to the change of the relative angle can be obtained. That is, a function as a rotation angle sensor can be obtained in such a manner that a magnetic field generation mechanism, such as a permanent magnet, is mounted to a rotation detection object, and that the rotating magnetic field generated in synchronization with the rotational movement of the rotation detection object is converted into an electric signal.

In particular, when a magneto-resistive effect element is used to detect an absolute angle of the rotation detection object, it is important that the detection sensitivity of the magneto-resistive effect element is isotropic with respect to the rotating magnetic field, and that the magneto-resistive effect element has a small detection error in any direction of the magnetic field. Further, it is also necessary that the detection angle of the magneto-resistive effect element is not deviated due to a change in the operating environment temperature.

In order to fulfill such requirements, there is proposed a rotation angle sensor which includes a plurality of magneto-resistive effect elements, each using a SV type GMR film having a pinned layer magnetized in a different direction, and in which the plurality of magneto-resistive effect elements are connected in the form of a bridge circuit.

Generally, it is difficult that only specific portions of a pinned layer of an SV type GMR film are respectively magnetized in a plurality of desired directions. Therefore, in order to obtain magneto-resistive effect elements having a plurality of magnetization directions, it is necessary to produce beforehand a plurality of magneto-resistive effect elements, each using an SV type GMR film having a pinned layer magnetized in a different direction. Then, the magneto-resistive effect elements are cut into separate element units, and the separate element units are mounted in a bridge circuit.

On the other hand, it is also strongly required that the rotation angle sensor is stably operated in a high temperature environment. From the viewpoint of maintaining the thermal stability of the SV type GMR film, how the magnetization of the pinned layer is strongly fixed becomes a bottleneck. The exchange coupling between the pinned layer and the antiferromagnetic layer generally disappears at a temperature of about 250° C. to 320° C., and hence it has been difficult to realize sufficient thermal stability of magnetization of the pinned layer.

In order to solve the above-described problems, Patent Literature 2 discloses, as another method for fixing magnetization of the pinned layer, a structure of a pinned layer which does not include an antiferromagnetic layer and which is formed of a first ferromagnetic layer/an antiferromagnetic coupling layer/a second ferromagnetic layer. For example, when a laminated structure composed of Co/Ru/Co is formed by a suitable production method so as to have a suitable thickness, the two Co layers are strongly interlayer-coupled to each other in an antiferromagnetic manner via the Ru layer. As a result, the magnetizations of the two Co layers, which are arranged antiparallel to each other, are hardly changed by an external magnetic field. This is applied in the technique described in Patent Literature 2. Here, such pinned layer structure is referred to as a self-pinned type.

In a self-pinned type pinned layer, the magnetization can be stably fixed at a higher temperature as compared with an ordinary pinned layer using an exchange coupling with an antiferromagnetic layer. Therefore, the self-pinned type pinned layer has a structure which is preferred to solve the above-described problems.

Further, the self-pinned type pinned layer has a significant advantage also in relation to a method for defining the magnetization direction.

Generally, the magnetization direction of an ordinary pinned layer using an exchange coupling with an antiferromagnetic layer is defined by annealing in which is performed under application of a magnetic field after a GMR film is formed. That is, in this method, it is difficult to magnetize a pinned layer on a same substrate in respective different directions.

On the other hand, the self-pinned type pinned layer can be magnetized in any direction by changing the direction of the magnetic field applied at the time of film formation. For this reason, a plurality of GMR films, each of which has a pinned layer magnetized in a different direction, can be formed in a same substrate.

Therefore, a step of forming magneto-resistive effect elements by using micro processing, and then a step of connecting electrode terminals to a bridge circuit formed by using the magneto-resistive effect elements can be performed in a same substrate. Therefore, a magnetic sensor can be produced by a simple production flow.

Patent Literature 3 describes a magnetic sensor produced by using the above-described method.

In Patent Literature 4, a method using local heating is described as a technique to magnetize a self-pinned type pinned layer in a plurality of directions.

In Patent Literature 5, a method is disclosed, which relates to control of the magnetization direction of a pinned layer, and which induces a uniaxial magnetic anisotropy by using texture formation by etching.

CITATION LIST

Patent Literature

Patent Literature 1
JP Patent No. 3040750
Patent Literature 2
JP Patent No. 3033934
Patent Literature 3
JP Patent Publication (Kokai) No. 2008-306112A
Patent Literature 4
JP Patent Publication (Kohyo) No. 2002-519873A
Patent Literature 5
JP Patent Publication (Kokai) No. 2007-142393A

SUMMARY OF INVENTION

Technical Problem

As described above, a magnetic sensor configured by a GMR film using a self-pinned type pinned layer has such advantages as that (1) it is excellent in thermal stability, and that (2) a plurality of magneto-resistive effect elements having pinned layers respectively magnetized in mutually different directions can be formed in a same substrate, and a bridge circuit can be formed by connecting the plurality of magneto-resistive effect elements.

However, for example, when pinned layers need to be magnetized in mutually different four directions, the step of forming a GMR film needs to be performed four times. In this case, the number of steps is large, resulting in disadvantages in terms of production tact and cost.

The detection angle error, which is important in the performance of a rotation angle sensor, is greatly affected by a variation in characteristics of each of the magneto-resistive effect elements configuring the bridge circuit. That is, when the characteristics of the GMR films respectively formed in four separate steps are varied, the performance in terms of detection angle error may be deteriorated. Further, in GMR films formed in four stages, in addition to a variation in the characteristics between the batches at the respective steps of forming the GMR films, the characteristics of the GMR films at the upper stage may be deviated due to an increase in the unevenness of the film surface, and the like.

In the technique described in Patent Literature 4, when the magnetization of the pinned layer is fixed, the thermal stability and the resistance against strong magnetic field need to be sacrificed, and hence a highly reliable magnetic sensor may be hardly obtained.

In the technique described in Patent Literature 5, the magnetization easy axis of the pinned layer can be controlled, but it is difficult to define in which direction along the magnetization easy axis the pinned layer is magnetized.

The present invention has been made in order to solve the above described problems. An object of the present invention is to provide a method in which, while the number of steps of forming GMR films is reduced, both the magnetization direction and orientation of the pinned layers can be defined.

Solution to Problem

In a method for producing a magneto-resistive effect element according to the present invention, the magnetization directions of pinned layers are respectively defined in a plurality of directions by forming a plurality of patterns having directivities. Further, when a magneto-resistive effect film is formed, a magnetic field is applied at an angle between the directions of the plurality of patterns.

Advantageous Effects of Invention

In the method for producing a magneto-resistive effect element according to the present invention, each time a step of forming a magneto-resistive effect film is performed once, the magneto-resistive effect film can be magnetized in a plurality of directions and orientations. Thereby, it is possible to obtain a high-performance magneto-resistive effect element which is less expensive and which has a small detection angle error and is excellent in thermal stability.

BRIEF DESCRIPTION OF DRAWINGS

FIG. 2 is a schematic view showing a method for forming a texture by using an ion beam etching method in step S101, and the like, in FIG. 1.

FIG. 3 is a view obtained by TEM observation after a GMR film is formed on the texture.

FIG. 4 is a view showing the arrangement of samples in each of which a texture is formed in order to investigate the direction of magnetization of the pinned layer.

FIG. 5 is a view showing measurement results of a relationship between the angle of an applied magnetic field (external magnetic field), and the resistance value of a GMR film.

FIG. 6 illustrates a method for producing the magneto-resistive effect element according to embodiment 1.

FIG. 12 is a flow chart showing a method for producing a magneto-resistive effect element according to embodiment 8.

DESCRIPTION OF EMBODIMENTS

Figure 1:
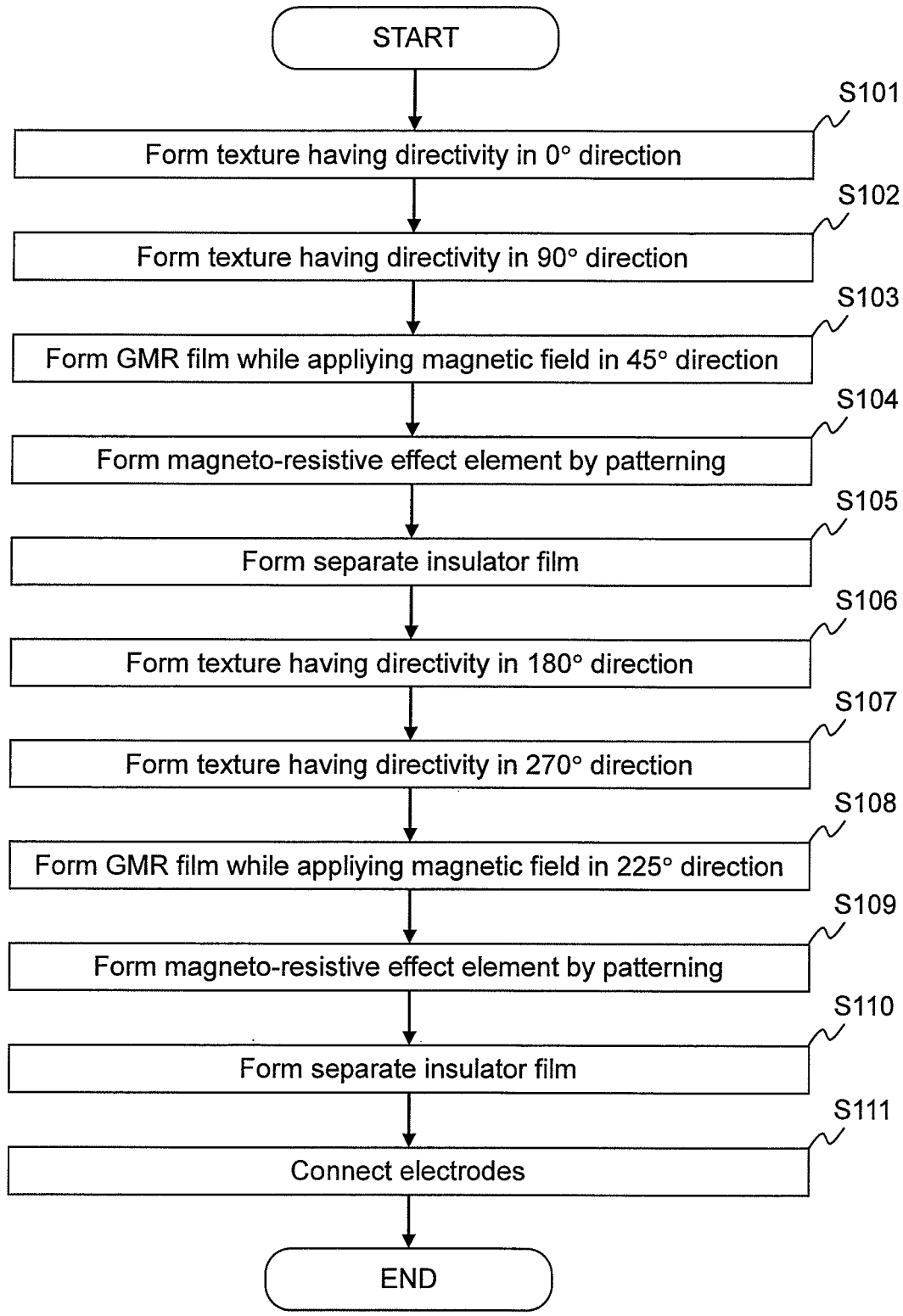
FIG. 1 is a flow chart showing a method for producing a magneto-resistive effect element according to embodiment 1.

In the following, embodiments according to the present invention will be described with reference to the accompanying drawings. In order to facilitate understanding, the same functional portions are denoted by the same reference numerals and characters in the following drawings.

Here, for simplicity of description, there will be described, as an example, a case of producing magneto-resistive effect elements having pinned layers respectively magnetized in directions at angles of 0°, 90°, 180°, and 270° with respect to a reference direction in the surface of a substrate. The above-described angles may be set to any angle as long as the angle satisfies requirements, such as desired performance. That is, the magnetization direction of the pinned layer according to the present invention is not limited to the directions at the above-described four angles.

Embodiment 1

FIG. 1 is a flow chart showing a method for producing a magneto-resistive effect element according to embodiment 1. The flow chart of FIG. 1 shows a procedure in which a GMR film is formed by laminating a pinned layer/a nonmagnetic layer/a free layer in order from the side of a substrate. In the following, each step of the flow chart of FIG. 1 will be described.

(FIG. 1: Step S101)

In a specific portion (first portion) on the substrate, a first texture (first pattern) having a linear shape is formed in the direction (first direction) at an angle of 0° with respect to a reference direction of the substrate. The actual texture is formed in a linear shape directed in the direction combining the 0° direction and the 180° direction with respect to the reference direction of the substrate.

Here, in order to distinguish step S101 from step S105 described below, it is assumed that the texture formed in step S101 is directed in the 0° direction with respect to the reference direction. Also in the following description, the direction of the texture is represented in the same way.

The method for forming the texture will be described again with reference to FIG. 2. The method for forming the texture in the following steps is also the same as this method. Note that the state where the present step is performed is illustrated again in FIG. 6(1) described below.

(FIG. 1: Step S102)

In a specific portion (second portion different from the first portion) on the substrate, a second texture (second pattern) having a linear shape is formed in the direction (second direction) at an angle of 90° with respect to the reference direction of the substrate. The actual texture is formed in a linear shape directed in the direction combining the 90° direction and the 270° direction with respect to the reference direction of the substrate. Note that the state where the present step is performed is illustrated again in FIG. 6(1) described below.

(FIG. 1: Step S103)

A GMR film is formed on the portions in which the first pattern and the second pattern are formed, respectively. At this time, a GMR film is formed while, at least in the process of forming a pinned layer, a magnetic field is applied in the direction at an angle of θ between the angles respectively formed by the first pattern and the second pattern and preferably in the direction at an angle of 45°. The magnitude of the magnetic field is set to a level which saturates a Co—Fe layer that is usually often used as a ferromagnetic layer of a GMR film. Specifically, it is preferred that the magnitude of the magnetic field is set to about several kA/m to several tens of kA/m.

In the pinned layer of the GMR film, a uniaxial magnetic anisotropy with its magnetization easy axis directed in the direction combining the 0° direction and the 180° direction, and a uniaxial magnetic anisotropy with its magnetization easy axis directed in the direction combining the 90° direction and the 270° direction are respectively induced by the directivities of the textures formed in step S101 and step S102. In other words, the magnetization directions of the pinned layer can be defined.

Further, when the GMR film is formed under the application of a magnetic field directed at an angle of θ=45°, the magnetic field is decomposed into a component directed in the 0° direction by the effect of the first texture, and a component directed in the 90° direction by the effect of the second texture. By these effects, the orientations of the magnetizations of the pinned layer are set to the 0° direction and the 90° direction, respectively.

That is, the magnetization directions of the pinned layer are respectively set to the "direction" combining the 0° direction and the 180° direction, and the "direction" combining the 90° direction and the 270° direction. Also, the orientations of the magnetizations of the pinned layer are explicitly set to the 0° "direction" and the 90° "direction", respectively.

Note that the state where the present step is performed is illustrated again in FIG. 6(2) described below.

(FIG. 1: Step S104)

The GMR film, which is obtained in step S101 to step S103 and in which the magnetization orientations are set to the 0° direction and the 90° direction, is processed into desired shapes by using a method, such as patterning, as described again below with reference to FIG. 6(3).

(FIG. 1: Step S105)

A separate insulator film, such as an $Al_2O_3$ film, is formed.

(FIG. 1: Step S106)

A third texture (third pattern) having a linear shape directed in the 180° direction with respect to the reference direction of the substrate is formed in a specific portion (third portion different from the first and second portions) on the substrate. The actual texture is formed in a linear shape directed in the direction combining the 0° direction and the 180° direction with respect to the reference direction of the substrate. Note that the state where the present step is performed is illustrated again in FIG. 6(4) described below.

(FIG. 1: Step S107)

A fourth texture (fourth pattern) having a linear shape directed in the 270° direction with respect to the reference direction of the substrate is formed in a specific portion (fourth portion different from the first to third portions) on the substrate. The actual texture is formed in a linear shape directed in the direction combining the 90° direction and the 270° direction with respect to the reference direction of the substrate. Note that the state where the present step is performed is illustrated again in FIG. 6(4) described below.

(FIG. 1: Step S108)

A GMR film is formed on the portions in which the third pattern and the fourth pattern are formed, respectively. At this time, a GMR film is formed while, at least in the process of forming a pinned layer, a magnetic field is applied in the direction at an angle of θ between the angles respectively formed by the third pattern and the fourth pattern, and preferably in the direction at an angle of 225°. The magnitude of the magnetic field may be set to the same level as in step S103.

In step S108, the orientations of the magnetizations of the pinned layer are respectively set to the 180° "direction" and the 270° "direction" according to the same principle as in step S103.

Note that the state where the present step is performed is illustrated again in FIG. 6(5) described below.

(FIG. 1: Step S109)

The GMR film, which is obtained in step S106 to step S108 and in which the magnetization orientations are set to the 180° direction and the 270° direction, is processed into desired shapes by using a method, such as patterning, as described again below with reference to FIG. 6(6).

(FIG. 1: Step S110)

A separate insulator film, such as an $Al_2O_3$ film, is formed.

(FIG. 1: Step S111)

A pair of electrodes is connected to the magneto-resistive effect element through a photo-resist step, an ion milling step, and an electrode layer forming step in this order.

In the above, a method for producing the magneto-resistive effect element according to embodiment 1 has been described.

Next, the details of each of the steps will be described.

FIG. 2 is a schematic view showing a method for forming a texture by using an ion beam etching method in step S101, and the like, in FIG. 1. FIG. 2(a) is a side view showing an arrangement of the substrate and an ion gun. FIG. 2(b) is a perspective view showing the state where the texture is formed on the substrate. In the following, step S101 of FIG. 1 is taken as an example, and the procedures for performing step S101 will be described.

(FIG. 1: Step S101: Procedure 1)

An $Al_2O_3$ film having a thickness of 30 nm is formed by a sputtering method on a glass substrate.

(FIG. 1: Step S101: Procedure 2)

The ion gun and the glass substrate are arranged so that the ion beam incident direction is set at 60° with respect to the normal direction of the glass substrate.

(FIG. 1: Step S101: Procedure 3)

The ion beam etching is performed for 30 seconds by using the ion gun.

(FIG. 1: Step S101: Procedure 4)

The glass substrate is rotated by 180°, and the ion beam etching is performed for 30 seconds by using the ion gun.

(FIG. 1: Step S101: Procedure 5)

The procedures 3 and 4 are repeatedly performed a predetermined number of times. As a result, a texture having a linear directivity as shown in FIG. 2(b) is formed.

As aforementioned, the details of step S101, and the like, shown in FIG. 1 have been described. Here, the procedure 3 and the procedure 4 are additionally described.

Generally, when the ion beam etching is performed, the substrate is rotated so that the etching amount in the surface is made uniform. In embodiment 1, the etching processing is applied to the substrate intentionally without rotating the substrate, and thereby the directivity is provided to the substrate in the etching direction. Thereby, a texture with a uniform etching amount in the surface can be formed so as to have a linear directivity.

FIG. 3 is a view obtained by TEM (Transmission Electron Microscope) observation after a GMR film is formed on the texture. FIG. 3(a) is a cross-sectional view along the line A-A' in FIG. 2. FIG. 3(b) is a cross-sectional view along the line B-B' perpendicular to the line A-A' in FIG. 2.

First, an $Al_2O_3$ film was formed on a glass substrate by a sputtering method. Next, a GMR film having a structure of Ta (3)/Ru (2)/$Co_{75}Fe_{25}$ (2.4)/Ru (0.35)/$Co_{90}Fe_{10}$ (2.5)/Cu (2.1)/$Co_{90}Fe_{10}$ (1)/$Ni_{85}Fe_{15}$ (2)/Cu (0.6)/Ta (2) was formed in order from the lower side by using the sputtering method. In the description of the structure of the GMR film, each numerical value in the parenthesis represents the thickness (unit: nm) of each film, and the value of each lower suffix represents an alloy composition (unit: at %). The details of the layer structure of the GMR film are as follows.

(Underlayer) Ta (3)/Ru (2)
(Pinned layer) $Co_{75}Fe_{25}$ (2.4)/Ru (0.35)/$Co_{90}Fe_{10}$ (2.5)
(Nonmagnetic layer) Cu (2.1)
(Free layer) $Co_{90}Fe_{10}$ (1)/$Ni_{85}Fe_{15}$ (2)
(Protective layer) Cu (0.6)/Ta (2)

Periodic depressions and projections were observed on the surface of $Al_2O_3$ film in the cross-section along the line A-A'. The period was about 10 nm and the amplitude was about 1 nm. It was confirmed that the depressions and projections having comparatively the same period and amplitude were also formed over the whole surface other than the illustrated portion. The cross-section along the line B-B' was almost flat, and the depressions and projections were not clearly recognized in the cross section.

That is, it can be seen that a texture having a directivity was formed by the ion beam etching in the above-described method.

Next, the influence of the texture having such directivity on the magnetic property of a ferromagnetic layer was studied.

First, similarly to the above, a texture having a directivity was formed in a glass substrate/$Al_2O_3$ film (30 nm) by ion beam etching. Then, a laminated film having a structure of Ta (3 nm)/Ru (2)/$Co_{75}Fe_{25}$ (3)/Ru (2) was formed. The magnetic property of the $Co_{75}Fe_{25}$ (3) layer was evaluated by using a VSM (vibrating sample magnetometer).

As a result of the evaluation, it was confirmed that a uniaxial magnetic anisotropy having (a) a magnetization hard axis in the A-A' direction in FIG. 2 and (b) a magnetization easy axis in the direction perpendicular to the paper surface in FIG. 2 is induced. The anisotropy field Hk obtained when the magnetization hard axis was magnetized was about 8 kA/m. Further, when the magnetization easy axis was magnetized, the coercivity Hce was about 1.6 kA/m.

When the ion beam etching was not performed, the anisotropy field Hk was about 0.6 kA/m and the coercivity Hce was about 1 kA/m. Thus, it can be seen that a large magnetic anisotropy was induced by forming the texture having the directivity.

Note that it has been confirmed that the magnetic anisotropy hardly depends on the existence and direction of a magnetic field applied at the time of forming the laminated film.

Next, evaluation results of characteristics of a GMR film formed on a texture having a directivity will be described.

First, similarly to the above, a texture having a directivity was formed in a glass substrate/$Al_2O_3$ film (30 nm) by ion beam etching. Then, a GMR film having the above-described structure of Ta (3 nm)/Ru (2)/$Co_{75}Fe_{25}$ (2.4)/Ru (0.35)/$Co_{90}Fe_{10}$ (2.5)/Cu (2.1)/$Co_{90}Fe_{10}$ (1)/$Ni_{85}Fe_{15}$ (2)/Cu (0.6)/Ta (2) was formed. Here, no magnetic field was applied at the time of forming the GMR film. The details of the structure of the above-described GMR film are described here.

In the self-pinned type pinned layer: $Co_{75}Fe_{25}$ (2.4)/Ru (0.35) $Co_{90}Fe_{10}$ (2.5), the $Co_{75}Fe_{25}$ (2.4) layer and the $Co_{90}Fe_{10}$ (2.5) layer are strongly interlayer-coupled to each other in an antiferromagnetic manner via the Ru (0.35) layer, and hence the magnetizations of the interlayer-coupled layers are arranged in an antiparallel configuration.

In order to stabilize the magnetization direction of the pinned layer, it is effective that (1) the interlayer coupling energy via the antiferromagnetic interlayer coupling layer (here Ru (0.35) layer) is large, and that (2) the effective amount of magnetization of the pinned layer is zero, that is, the amount of magnetization of the $Co_{75}Fe_{25}$ (2.4) layer is equal to the amount of magnetization of the $Co_{90}Fe_{10}$ (2.5). Here, the film thickness of the Cu layer was set to 2.1 nm so that the interlayer coupling magnetic field acting between the pinned layer and the free layer is set to be zero.

The GMR film structure shown here is only a typical example. Thus, even when the material and the film thickness are optimized so as to obtain a more preferred results on the magneto-resistive effect (MR) characteristics and the magnetic characteristics of the ferromagnetic layer, such optimization does not hinder the present invention.

First, for comparison, the MR characteristics in the case where no texture was formed were measured by a DC four-terminal method. In this case, the magnetization direction of the pinned layer was not fixed in one direction, and hence excellent MR characteristics were not obtained.

On the other hand, when the texture was formed, a MR ratio (magneto-resistance change ratio) of about 10% was obtained, so that excellent MR characteristics were exhibited. From the shape of the MR curve, a state was confirmed in which the magnetization of the pinned layer and the magnetization of the free layer were set in the parallel configuration (minimum resistance) and in the antiparallel configuration (maximum resistance) according to the magnitude of the applied magnetic field. Further, when the magnitude of the applied magnetic field was gradually increased, it was confirmed that the magnetization direction of the pinned layer was stably fixed under an applied magnetic field having a magnitude of up to 150 kA/m.

Next, the magnetization direction of the pinned layer was investigated in detail.

FIG. 4 is a view showing an arrangement of samples in each of which a texture is formed in order to investigate the direction of magnetization of a pinned layer. As shown in the figure, two samples were prepared in each of which a texture having a directivity was formed in a glass substrate/$Al_2O_3$ film (30 nm) by ion beam etching. Next, the two samples were arranged so that the directions of the textures having directivities become perpendicular to each other. Then, the above-described GMR film was formed without application of magnetic field.

Here, attention is directed to the magnetization direction of the $Co_{90}Fe_{10}$ (2.5) layer in contact with the Cu (2.1) layer, as the magnetization direction of the pinned layer.

First, the dependency of the resistance of the GMR film on the direction of the external magnetic field was evaluated in order to obtain the magnetization direction of the pinned layer. In the state where the magnitude of the external magnetic field is fixed to 16 kA/m, the measurement was carried out by changing the application direction of the external magnetic field in increments of 15° from 0° to 360°.

Since the magnetization direction of the pinned layer is stable to the applied magnetic field of 16 kA/m, the magnetization direction of the pinned layer is not changed. On the other hand, since the magnetization direction of the free layer is directed to the direction of the applied magnetic field, the relative angle between the magnetization of the pinned layer and the magnetization of the free layer is changed, so that a GMR effect (resistance change of the GMR film) is exhibited.

FIG. 5 is a view showing measurement results of a relationship between the angle of applied magnetic field (external magnetic field), and the resistance value of a GMR film. The upper view of FIG. 5 shows a measurement result obtained from the texture on the left side of FIG. 4, and the lower view of FIG. 5 shows a measurement result obtained from the texture on the right side of FIG. 4. The resistance of the GMR film changes like a sinusoidal wave relative to the external magnetic field. When the upper and lower waveforms in FIG. 5 are compared with each other, it can be seen that the phases of the waveforms are different from each other due to the difference between the directivity directions of the textures.

It can be said that the angle of the applied magnetic field at the time when the resistance of the GMR film is a minimum coincides with the magnetization direction of the pinned layer. This is because it is conceivable that the direction of the applied magnetic field is coincident with the direction of magnetization of the free layer, and that, when the resistance of the GMR film is a minimum, the direction of magnetization of the pinned layer is coincident with the direction of magnetization of the free layer (that is, the angle of applied magnetic field).

The magnetization directions of the pinned layers of the samples, which are arranged so that the directions of the textures having directivities are orthogonal to each other, can be estimated as the −90° direction and the −180° direction, respectively. That is, this evidently means that the pinned layer could be magnetized in the two directions orthogonal to each other by performing the step of forming the GMR film once.

In embodiment 1, the pinned layer can be magnetized in the two directions orthogonal to each other as described above, and further the orientation of magnetization of the pinned layer can also be defined by applying a magnetic field at the time when the GMR film is formed.

Note that the magnetization of the pinned layer of the GMR film formed under application of a magnetic field in the direction at θ=45° is not affected by the film forming step subsequently performed under application of a magnetic field in the direction at θ=225°. This is because, as described above, the self-pinned type pinned layer: $Co_{75}Fe_{25}$ (2.4)/Ru (0.35)/$Co_{90}Fe_{10}$ (2.5), the magnetization direction of which is defined, has a large uniaxial magnetic anisotropy induced by the directed texture, and a strong antiferromagnetic interlayer coupling via the Ru (0.35) layer, and thereby has a very stable magnetization direction. That is, unless a magnetic field not less than about 150 kA/m is applied, the magnetization direction of the pinned layer is not changed.

FIG. 6 illustrates a method for producing the magneto-resistive effect element according to embodiment 1. Here, a plan view in which the glass substrate is seen from the above is illustrated for each step. In the following, each of the steps shown in FIG. 6 will be described.

(1) Texture formation (0°, 90°)

On the surface of the glass substrate on which an $Al_2O_3$ film is formed, a resist pattern is formed by a photo-resist step so that a texture is formed only in a desired portion. Subsequently, a texture having a directivity is formed by a method described above. This step flow is performed twice so that the textures having directivities orthogonal to each other are formed.

The present step corresponds to step S101 and step S102 in FIG. 1. In the present step, a texture having a directivity in the 0° direction with respect to the reference direction (the right direction in FIG. 6) of the glass substrate, and a texture having a directivity in the 90° direction with respect to the reference direction are formed.

(2) Formation of GMR film (θ=45°)

When a GMR film is formed, and particularly at least when a pinned layer (here $Co_{75}Fe_{25}$ (2.4) layer) on the side in contact with the underlayer is formed, the GMR film is formed while a magnetic field is applied in the direction at an angle θ (0°<θ<90°), for example, preferably in the 45° direction.

By the effect of the textures formed beforehand, the applied magnetic field is decomposed into a component directed in the 0° direction with respect to the reference direction of the glass substrate, and a component directed in the 90° direction with respect to the reference direction. By the effect of the magnetic field components, the pinned layer of the GMR film is magnetized in the 0° direction and the 90° direction.

Note that the angle of the magnetic field to be applied is not necessarily 45°. This is because, when a magnetic field is applied in the direction of an angle between the angles of the two textures, the applied magnetic field is eventually decomposed into a component in the 0° direction and a component in the 90° component due to the effect of the textures.

The present step corresponds to step S103 in FIG. 1.

(3) Element Formation

A resist pattern is formed by a photo-resist step. Subsequently, the magneto-resistive effect element is processed into a desired shape by an ion milling method, and the resist is exfoliated. By the present step, two magneto-resistive effect elements are obtained in which the magnetization directions of the pinned layers of the GMR films are respectively oriented in the 0° direction with respect to the reference direction of the glass substrate and in the 90° direction with respect to the reference direction.

The present step corresponds to step S104 in FIG. 1.

(4) Texture Formation (180°, 270°)

Similarly to step (1), the procedure for forming a texture on the surface of the glass substrate is performed twice.

The present step corresponds to step S106 to step S107 in FIG. 1. In the present step, a texture having a directivity in the 180° direction with respect to the reference direction (the right direction in FIG. 1) of the glass substrate, and a texture having a directivity in the 270° direction with respect to the reference direction are formed.

Note that in the present step, the portions in which textures are to be formed are arranged so as to respectively face the portions in which the two textures are formed beforehand. That is, it is arranged such that the first portion faces the third portion, and the second portion faces the fourth portion. Thereby, four textures respectively directed in four different directions (0°, 90°, 180°, 270°) with respect to the reference direction of the glass substrate are formed.

(5) Formation of GMR Film (θ=225°)

When a GMR film is formed, and particularly at least when a pinned layer (here $Co_{75}Fe_{25}$ (2.4) layer) on the side in contact with the underlayer is formed, the GMR film is formed while a magnetic field is applied in the direction at an angle θ (180°<θ<270°), for example, preferably in the 225° direction.

By the effect of the textures formed beforehand, the applied magnetic field is decomposed into a component directed in the 180° direction with respect to the reference direction of the glass substrate, and a component directed in the 270° direction with respect to the reference direction. By the effect of the magnetic field components, the pinned layer of the GMR film is magnetized in the 180° direction and the 270° direction.

The present step corresponds to step S108 in FIG. 1.

(6) Element Formation

Similarly to step (3), two magneto-resistive effect elements are formed. By the present step, two magneto-resistive effect elements, in which the magnetization directions of the pinned layers of the GMR films are respectively orientated in the 180° direction with respect to the reference direction of the glass substrate and in the 270° direction with respect to the reference direction, are obtained. The present step corresponds to step S109 in FIG. 1.

The characteristics of each of the magneto-resistive effect elements produced by using the production method described above were evaluated. As a result of the evaluation, it was found that the magnetization directions of the pinned layers were fixed in the four directions at 0°, 90°, 180°, and 270°, as intended, and MR characteristics with a small variation could be obtained.

Figure 7:
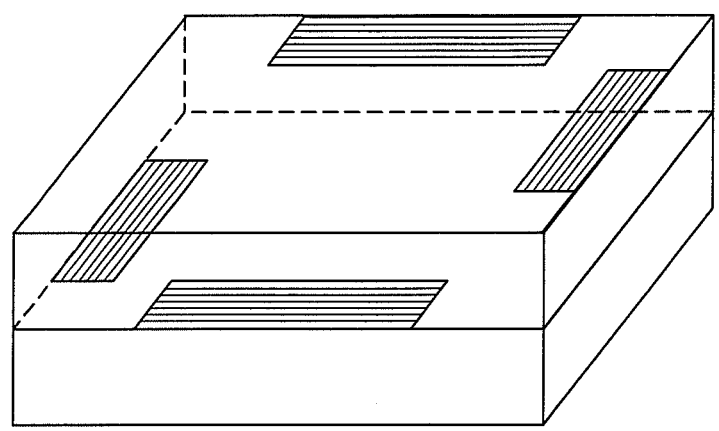
FIG. 7 is a schematic view showing a configuration example of a magneto-resistive effect element.

FIG. 7 is a schematic view showing a configuration example of magneto-resistive effect elements. The series of steps (1) to (3) and the series of steps (4) to (6) in FIG. 6 are individually performed. Then, the layers obtained by the one series of steps are superposed on the layers obtained by the other series of steps, so that an element structure as shown in FIG. 7 is obtained.

The magneto-resistive effect element produced by using the method according to embodiment 1 is featured in that the texture is formed on the substrate, and in that one GMR film is magnetized in a plurality of directions.

As described above, in embodiment 1, two textures are formed on a glass substrate, and then a GMR film is formed while a magnetic field is applied at an angle between the angles of the textures.

Thereby, the GMR film having the pinned layer magnetized in two directions can be formed only by performing the step of forming the GMR film once. Further, the magnetic field applied at the time of forming the GMR film is decomposed into two components directed in the 0° direction and the 90° direction with respect to the reference direction of the glass substrate, and hence the magnetization directions of the pinned layer of the GMR film can be defined in the 0° direction and the 90° direction, respectively.

Embodiment 2

In embodiment 2 according to the present invention, a magnetic sensor configured by using the magneto-resistive effect element described in embodiment 1 will be described.

A magnetic sensor for detecting the rotational angle of a magnetic field can be configured by using magneto-resistive effect elements which are formed on a same substrate by magnetizing a pinned layer in four directions at 0°, 90°, 180°, and 270° by using the method as described above.

Figure 8:
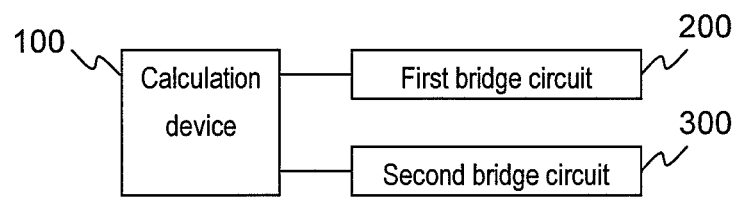
FIG. 8 is a functional block diagram of a magnetic sensor according to embodiment 2.

FIG. 8 is a functional block diagram of the magnetic sensor according to embodiment 2.

The magnetic sensor according to embodiment 2 includes a first bridge circuit 200 configured by two pairs of magneto-resistive effect elements having pinned layers respectively magnetized in the 0° direction and the 180° direction, and a second bridge circuit 300 configured by two pairs of magneto-resistive effect elements having pinned layers respectively magnetized in the 90° direction and the 270° direction. Further, the magnetic sensor includes a calculation device 100 which calculates an absolute angle of an angle detection object by using the outputs of the respective bridge circuits.

Figure 9:
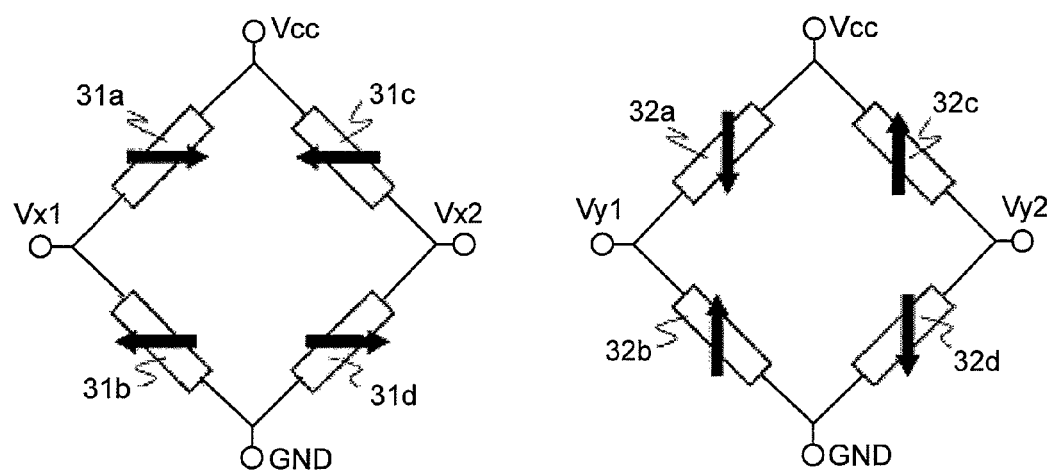
FIG. 9 is an equivalent circuit diagram of the respective bridge circuits.

FIG. 9 is an equivalent circuit diagram of each of the bridge circuits. The first bridge circuit 200 includes magneto-resistive effect elements 31a, 31b, 31c and 31d. The second bridge circuit 300 includes magneto-resistive effect elements 32a, 32b, 32c and 32d. The arrow shown in the equivalent circuit represents the magnetization direction of the pinned layer (here, attention is directed to the magnetization direction of $Co_{90}Fe_{10}$ (2.5) layer in contact with the Cu (2.1) layer).

Figure 10:
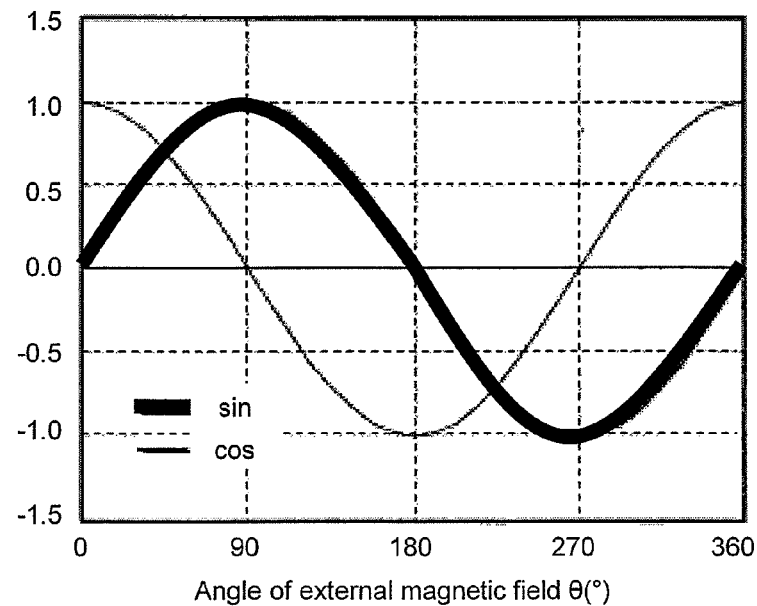
FIG. 10 is a view showing outputs of the first bridge circuit and the second bridge circuit.

FIG. 10 is a view showing outputs of a first bridge circuit and a second bridge circuit. The outputs of the respective bridge circuits have sinusoidal waveforms shifted in phase from each other by 90°. The absolute angle of the external magnetic field applied to the magnetic sensor can be calculated by performing an arctangent operation using the outputs of the first bridge circuit 200 and the second bridge circuit 300.

Therefore, when a permanent magnet is mounted to a rotating detection object, and when the magnetic sensor detects the magnetic field generated from the permanent magnet, it is possible to realize a rotation angle detection device which calculates the absolute angle of the detection object.

When a rotation angle detection device produced by such method was tested, extremely excellent results, such as a small angle detection error, and high reliability in thermal stability, and the like, were obtained. The results are based on that the variation of characteristics of each of the magneto-resistive effect elements is small. As reasons why the variation of characteristics of each of the magneto-resistive effect elements is small, the following (reason 1) and (reason2) are conceivable.

(Reason 1) Even by a small number of times of performing the step of forming the GMR film, the pinned layer can be magnetized in the four directions at 0°, 90°, 180°, and 270°. Thereby, the influence of the characteristics variation between batches at the time of forming the GMR film was suppressed.

(Reason 2) Since the number of times of performing the step of forming the GMR film was reduced, the influence of the increase of surface unevenness due to the film growth was reduced, and the deviation of characteristics of the upper and lower GMR films was reduced.

It should be noted that, because of simplification of the flow of the production steps, the effects of reducing the production tact and cost are exhibited at the same time.

As described above, the magnetic sensor according to embodiment 2 was produced by using the magneto-resistive effect elements produced by the method described in embodiment 1.

Thereby, it is possible to obtain a magnetic sensor with a small characteristic variation of the respective magneto-resistive effect elements. Further, it is possible to obtain a magnetic sensor which has a small angle detection error and which is excellent in reliability, such as thermal stability. Further, since the step of forming the GMR film is simplified, it is possible to reduce the production tact and cost.

Embodiment 3

Figure 11:
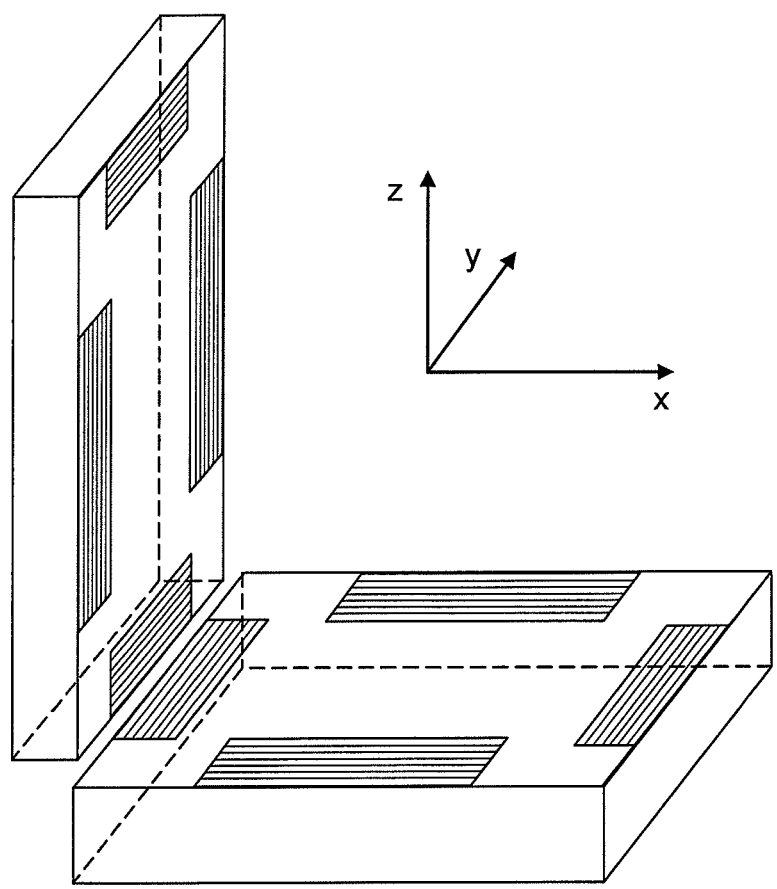
FIG. 11 is a schematic view of a magnetic sensor according to embodiment 3.

FIG. 11 is a schematic view of a magnetic sensor according to embodiment 3. For simplicity of description, FIG. 11 shows an example in which four textures are formed on the same substrate.

A magnetic detection section which detects a magnetic field in the normal direction (the z axis direction in FIG. 11) of the xy plane in FIG. 11 is configured by arranging the magneto-resistive effect elements described in embodiments 1 and 2 on flat surfaces orthogonal to each other. Thereby, a three-dimensional magnetic sensor can be configured.

Note that, in FIG. 11, the textures along the y-axis are duplicated, and hence the detection objects of the magneto-resistive effect elements in this direction are also duplicated. It is additionally described that the duplicated portion is not necessarily needed.

Note that the magnetic detection section which detects the magnetism in the z axis direction in FIG. 11 is not necessarily configured by magneto-resistive effect elements, and any magnetic detection method can be used for the magnetic detection section.

As described above, according to embodiment 3, it is possible to obtain a three-dimensional magnetic sensor which has the same effect as the magneto-resistive effect elements described in embodiment 1 and embodiment 2.

Embodiment 4

In embodiment 4 according to the present invention, another configuration example of a GMR film is described.

In embodiment 1, a configuration of a GMR film using a self-pinned type pinned layer not including an antiferromagnetic layer is described. On the other hand, a GMR film using an irregular antiferromagnetic layer exchange-coupled to a ferromagnetic layer in contact with the irregular antiferromagnetic layer can be produced by a production method similar to the method in embodiment 1 under application of a magnetic field without annealing.

As an example of a material of the antiferromagnetic layer, it is possible to use a material expressed by Mn—X same as MnIr and MnRu (where X is at least one element selected from the group of Ru, Rh, Pd, Re, Os, Ir, Pt, Au, Cr, Fe and Ni).

The GMR film in embodiment 4 has a structure of Ta (3 nm)/Ru (2)/$Mn_{80}Ir_{20}$ (6)/$Co_{75}Fe_{25}$ (2.4)/Ru (0.35)/$Co_{90}Fe_{10}$ (2.5)/Cu (2.1)/$Co_{90}Fe_{10}$ (1)/$Ni_{85}Fe_{15}$ (2)/Cu (0.6)/Ta(2).

The magneto-resistive effect element using the structure of the GMR film according to embodiment 4 can be produced by a method similar to the method of embodiment 1.

Embodiment 5

In embodiment 5 according to the present invention, a preferred example of a texture form will be described in detail. The other configuration and method are the same as those in embodiment 1 to embodiment 4.

In embodiment 5, the study was carried out in the state where ion beam etching conditions, specifically, the angle between the normal direction of the substrate and the ion beam incident direction, the type of gas of ions, the acceleration condition of the ions, and the like, were changed from those in embodiment 1. As a result of the study, it was found that the period of depressions and projections of the texture is preferably in the range of 2 nm or more to 100 nm or less.

When the period was too short, the texture was formed in a substantially uniform surface shape by etching, and thereby clear depressions and projections, that is, texture characteristics, were not recognized. In this case, the uniaxial magnetic anisotropy was not induced in the pinned layer formed on the texture, and hence the object of the invention was not achieved. On the other hand, when the period was too long, a structure having depressions and projections could be confirmed, but the effect of inducing the uniaxial magnetic anisotropy was significantly reduced.

Further, it was found that the amplitude of depressions and projections is preferably in the range of 0.5 nm or more to 2.5 nm or less. According to the increase in the amplitude of depressions and projections, the magnitude of the uniaxial magnetic anisotropy induced in the pinned layer formed on the texture was monotonously increased. In particular, there was a tendency that the magnitude of the uniaxial magnetic anisotropy is steeply increased from the amplitude of 0.5 nm, and is saturated at the amplitude of about 2.8 nm.

However, when the amplitude of depressions and projections of the texture exceeds 2.5 nm, ferromagnetic interlayer coupling between the pinned layer and the free layer was recognized, and hence the amplitude of depressions and projections is preferably in the range of 2.5 nm or less.

Note that the film thickness of each layer is about 2 to 3 nm, and hence the numerical value of 2.5 nm representing the amplitude of depressions and projections provides an impression that the numerical value is too large. However, as can be seen from FIG. 3, the depressions and projections of about 1 nm seen in the texture are reduced toward the deposition direction of the underlayer of the GMR film, and almost no uneven structure is seen on the outermost surface of the pinned layer on the side of the underlayer.

The depressions and projections at the boundary surface fundamentally cause a reduction in the antiferromagnetic interlayer coupling in the pinned layer via the Ru layer, and an increase in the ferromagnetic interlayer coupling between the pinned layer and the free layer. Therefore, it is very advantageous that the depressions and projections at the boundary surface are small in the region above the underlayer side of the pinned layer as shown in FIG. 3.

Embodiment 6

In embodiment 6 according to the present invention, another example of structure of the pinned layer will be described. The other structure and method are the same as those in embodiment 1 to embodiment 5.

It goes without saying that the stability of magnetization of the pinned layer is improved as the uniaxial magnetic anisotropy induced by the formation of the texture is increased. Thus, in embodiment 6, the uniaxial magnetic anisotropy was evaluated in the case where the composition of the pinned layer was changed from the composition in embodiment 1. Note that $Co_{75}Fe_{25}$ (2.4 nm) is used as the composition of the pinned layer in embodiment 1.

When $Co_{50}Fe_{50}$ was used as the composition of the pinned layer, an anisotropic magnetic field of 24 kA/m was obtained. Note that, in the composition of embodiment 1, the anisotropic magnetic field was 8 kA/m. Further, when a comparison was performed by forming a Co—Fe film on the same texture, it was found that the magnetization easy axis of the pinned layer having the composition of $Co_{75}Fe_{25}$ is shifted by 90° from the magnetization easy axis of the pinned layer having the composition of $Co_{50}Fe_{50}$.

A Co—Fe alloy may have a fcc (face-centered cubic) crystal structure or a bcc (body-centered cubic) crystal structure depending on the composition of the Co—Fe alloy. Within the range of the study, when a pinned layer was formed on a texture by using a Co—Fe alloy having a bcc crystal structure, a larger uniaxial magnetic anisotropy was obtained.

It should be noted that the crystal structure on the underlayer side of the pinned layer is aligned with the crystal structure on the nonmagnetic layer side of the pinned layer. This is because, when materials whose magnetization easy axes are orthogonal to each other are selected and laminated (for example, $Co_{50}Fe_{50}$ (2.1 nm)/Ru(0.35)/$Co_{90}Fe_{10}$ (2.5)), the magnetization of the self-pinned type pinned layer becomes unstable.

The Co—Fe layers become an important factor for the stability of magnetization of the pinned layer and for obtaining further excellent MR characteristics. For example, a structure, such as $Co_{50}Fe_{50}$ (2.1 nm)/Ru (0.35)/$Co_{50}Fe_{50}$ (1.9 nm)/$Co_{90}Fe_{10}$ (1.0), is preferred.

Embodiment 7

In embodiment 7 according to the present invention, another example of structure of the free layer will be described. The other structure and method are the same as those in embodiment 1 to embodiment 6.

In embodiment 1, an example using $Co_{90}Fe_{10}$ (1 nm)/$Ni_{85}Fe_{15}$ (2) as a composition of the free layer is described. As a result of a detailed evaluation, it was found that the uniaxial magnetic anisotropy induced by the texture also affects the free layer. That is, it was recognized that an anisotropic magnetic field Hk of about 6 kA/m is induced also in the free layer.

When the free layer has a large magnetic anisotropy, there is a possibility that the follow-up performance to a signal magnetic field is deteriorated to affect the angle detection accuracy. Therefore, a preferred form can be said to be a form in which a strong uniaxial magnetic anisotropy is induced in the pinned layer by the texture, and in which an uniaxial magnetic anisotropy is not imparted in the free layer as much as possible.

In order to realize this form, it is effective to reset the crystal growth by inserting a layer having an amorphous structure or a structure close to the amorphous structure in a part of the GMR film. As an example of the material, a material having a structure of $Co_{72}Fe_8B_{20}$, and the like, is preferred. For example, the free layer is formed to have a structure, such as $Co_{90}Fe_{10}$ (1 nm)/$Co_{72}Fe_8B_{20}$ (7). Thereby, the anisotropic magnetic field Hk could be reduced to 2 kA/m or less with almost no deterioration of the MR characteristics. Further, when such free layer structure was used, a further advantageous secondary effect that the anisotropy MR effect (AMR) of the free layer is reduced was also confirmed.

In the above, an example in which the amorphous layer was applied to the uppermost layer of the free layer is described. As for the position at which the amorphous layer is applied, even when any of the other structures, such as (1) a structure in which the amorphous layer is inserted in a portion in the pinned layer on the side of the nonmagnetic layer, and (2) a structure in which the amorphous layer is inserted in the free layer, is used, the same effect as that of embodiment 7 can be obtained.

Embodiment 8

In embodiment 8 according to the present invention, a method will be described in which a magneto-resistive effect element is produced by procedures different from those of the production method described in embodiment 1.

In embodiment 8, the laminating order of the respective layers at the time of forming a GMR film is different from that in embodiment 1. In embodiment 8, a free layer/a nonmagnetic layer/a pinned layer are laminated in order from the side of the substrate. Further, in conjunction with the laminating order, the layer on which the texture is formed is different from the layer in embodiment 1.

FIG. 12 is a flow chart showing a method for producing a magneto-resistive effect element according to embodiment 8. In the following, each step of FIG. 12 will be described.

(FIG. 12: Step S1201)

A GMR is formed while, at least in the process of forming a pinned layer, a magnetic field is applied in the direction at an angle θ between a predetermined reference direction (first direction) and the direction (second direction) orthogonal to the reference direction, and preferably in the direction at the middle angle between the two directions. The magnitude of the magnetic field is set similarly to step S103 in embodiment 1. In the following, for the sake of brevity of description, similarly to embodiment 1, the first direction is set as the 0° direction with respect to the reference direction, and the second direction is set as the 90° direction with respect to the reference direction.

In step S1201, the direction of magnetization of the pinned layer of the GMR film is temporarily defined in the direction at θ=45°.

(FIG. 12: Step S1202)

A first texture (first pattern) having a linear shape is formed in a specific portion (first portion) on the GMR film in the 0° direction with respect to the reference direction. The actual texture is formed in a linear shape directed in the direction combining the 0° direction and the 180° direction with respect to the reference direction. As a method for forming the texture, for example, an ion beam etching method may be used similarly to FIG. 2.

(FIG. 12: Step S1203)

A second texture (second pattern) having a linear shape is formed in a specific portion (second portion different from the first portion) on the GMR film in the 90° direction with respect to the reference direction. The actual texture is formed in a linear shape directed in the direction combining the 90° direction and the 270° direction with respect to the reference direction.

In the pinned layer of the GMR film, a uniaxial magnetic anisotropy with its magnetization easy axis directed in the direction combining the 0° direction and 180° direction, and a uniaxial magnetic anisotropy with its magnetization easy axis directed in the direction combining the 90° direction and 270° direction are induced by the directivity of the textures formed in step S1202 and step S1203.

The direction of magnetization of the pinned layer, which direction is temporarily set to the direction of θ=45°, is set in the direction of θ=0° and the direction of θ=90° by these textures. As a result, the state, in which the desired specific portions of the pinned layer are respectively magnetized in the 0° direction and the 90° direction, can be formed by performing the step of forming the GMR film once.

(FIG. 12: Step S1204 to Step S1205)

These steps are the same as step S104 and step S105 in FIG. 1.

(FIG. 12: Step S1206)

A GMR is formed while, at least in the process of forming a pinned layer, a magnetic field is applied in the direction at an angle of θ between the 180° direction and the 270° direction with respect to the reference direction, and preferably in the direction of θ=225°. The magnitude of the magnetic field is set similarly to step S103 in embodiment 1.

In step S1206, the direction of magnetization of the pinned layer of the GMR film is temporarily defined in the direction of θ=225°.

(FIG. 12: Step S1207)

A third texture (third pattern) having a linear shape is formed in a specific portion (third portion different from the first portion and the second portion) on the GMR film in the 180° direction with respect to the reference direction. The actual texture is formed in a linear shape directed in the direction combining the 0° direction and the 180° direction with respect to the reference direction.

(FIG. 12: Step S1208)

A fourth texture (fourth pattern) having a linear shape is formed in a specific portion (fourth portion different from the first portion to the third portion) on the GMR film in the 270° direction with respect to the reference direction. The actual texture is formed in a linear shape directed in the direction combining the 90° direction and the 270° direction with respect to the reference direction.

In the pinned layer of the GMR film, a uniaxial magnetic anisotropy with its magnetization easy axis directed in the direction combining the 0° direction and 180° direction, and a uniaxial magnetic anisotropy with its magnetization easy axis directed in the direction combining the 90° direction and 270° direction are induced by the directivity of the textures formed in step S1207 and step S1208.

The direction of magnetization of the pinned layer, which direction is temporarily set in the direction of θ=225°, is set in the direction of θ=180° and the direction of θ=270° by these textures. As a result, the state, in which the desired specific portions of the pinned layer are respectively magnetized in the 180° direction and the 270° direction, can be formed by performing the step of forming the GMR film once.

(FIG. 12: Step S1209 to Step S1211)

These steps are the same as step S109 to step S111 in FIG. 1.

In the above, the method for producing the magneto-resistive effect element according to embodiment 8 has been described.

In embodiment 8, a structure, such as Ta (3 nm)/Ru (2)/$Ni_{85}Fe_{15}$ (2)/$Co_{90}Fe_{10}$ (1)/Cu (2.1)/$Co_{90}Fe_{10}$ (2.5)/Ru (0.35)/$Co_{75}Fe_{25}$ (2.4)/Ta (2), can be used as a structure of the GMR film.

In embodiment 8, the lamination order of the GMR film is reversed as compared with embodiment 1, and hence the flow of the production method is changed. However, it can be considered that the essential method is the same as that in embodiment 1. Therefore, the techniques described in embodiment 1 can be applied to the detailed procedures of the respective steps in embodiment 8, and hence detailed description of the procedures is omitted.

In embodiment 8, the procedure of performing the step of forming a texture four times is described, but a procedure of performing the step of forming the textures two times may also be adopted. In this case, in each of the step of forming a GMR film by applying a magnetic field in the direction of θ=45°, and of the step of forming a GMR film by applying a magnetic field in the direction of θ=225°, the GMR film is selectively formed only in required portions by using a mask.

Note that, in the free layer of the magneto-resistive effect element produced by using the method for producing the magneto-resistive effect element according to the embodiment 8, the effect that a uniaxial magnetic anisotropy is imparted by the texture was not recognized. It can be said that this is preferred in the sense that, unlike embodiment 1, the angle detection error is not deteriorated.

Embodiment 9

It is additionally described that, in place of the methods, such as the ion beam etching method and the sputtering method, which are used to form the respective layers and described in embodiment 1 to embodiment 8, the other methods having the same effects can also be used in the present invention.

REFERENCE SIGNS LIST 31a to 31d and 32a to 32d: Magneto-resistive effect element
100: Calculation device
200: First bridge circuit
300: Second bridge circuit

The invention claimed is:

1. A method for producing a magneto-resistive effect element by using a magneto-resistive effect film formed by laminating a pinned layer, a nonmagnetic layer, and a free layer in order from the side of a substrate, the method comprising:

a first pattern forming step of forming a first linear pattern in a first portion on the substrate in a first direction;

a second pattern forming step of forming a second linear pattern in a second portion on the substrate in a second direction;

a magneto-resistive effect film forming step of forming a magneto-resistive effect film on the substrate while applying a magnetic field in a direction at a predetermined magnetic field application angle; and an element forming step of forming a magneto-resistive effect element having a pair of electrodes by processing the magneto-resistive effect film into a predetermined shape, wherein the magnetic field application angle is set to an angle between the angles of the first direction and the second direction, and wherein a series of the first pattern forming step, the second pattern forming step, the magneto-resistive effect film forming step, and the element forming step is performed a plurality of times while the first direction, the second direction, the first portion, and the second portion are changed each time the series of the steps is performed.

2. A method for producing a magneto-resistive effect element by using a magneto-resistive effect film formed by laminating a free layer, a nonmagnetic layer, and a pinned layer in order from the side of a substrate, the method comprising:

a magneto-resistive effect film forming step of forming a magneto-resistive effect film on the substrate while applying a magnetic field in a direction at a predetermined magnetic field application angle;

a first pattern forming step of forming a first linear pattern in a first portion on the magneto-resistive effect film in a first direction;

a second pattern forming step of forming a second linear pattern in a second portion on the magneto-resistive effect film in a second direction; and an element forming step of forming a magneto-resistive effect element having a pair of electrodes by processing the magneto-resistive effect film into a predetermined shape, wherein the magnetic field application angle is set to an angle between the angles of the first direction and the second direction, and wherein a series of the magneto-resistive effect film forming step, the first pattern forming step, the second pattern forming step, and the element forming step is performed a plurality of times while the first direction, the second direction, the first portion, and the second portion are changed each time the series of the steps is performed.

3. The method for producing the magneto-resistive effect element according to claim 1, wherein the second direction is set in the 90 degree direction with respect to the first direction, wherein the first pattern forming step, the second pattern forming step, the magneto-resistive effect film forming step, and the element forming step are performed twice, respectively, wherein the first portion at the time of performing the first pattern forming step at the second time is set to a position facing the first portion at the time of performing the first pattern forming step at the first time, and wherein the second portion at the time of performing the second pattern forming step at the second time is set to a position facing the second portion at the time of performing the second pattern forming step at the first time.

4. The method for producing the magneto-resistive effect element according to claim 1, wherein the magnetic field application angle is set to a half of the angle between the first direction and the second direction.

5. The method for producing the magneto-resistive effect element according to claim 3, wherein, when the magneto-resistive effect film forming step is performed at the first time, the magnetic field application angle is set to an angle of 45 degrees with respect to the first direction and the second direction, and wherein, when the magneto-resistive effect film forming step is performed at the second time, the magnetic field application angle is set to an angle obtained by adding +180 degrees to the magnetic field application angle at the time of performing the magneto-resistive effect film forming step at the first time.

6. The method for producing the magneto-resistive effect element according to claim 2, wherein the second direction is set in the 90 degree direction with respect to the first direction, wherein the first pattern forming step, the second pattern forming step, the magneto-resistive effect film forming step, and the element forming step are performed twice, respectively, wherein the first portion at the time of performing the first pattern forming step at the second time is set to a position facing the first portion at the time of performing the first pattern forming step at the first time, and wherein the second portion at the time of performing the second pattern forming step at the second time is set to a position facing the second portion at the time of performing the second pattern forming step at the first time.

7. The method for producing the magneto-resistive effect element according to claim 2, wherein the magnetic field application angle is set to a half of the angle between the first direction and the second direction.

8. The method for producing the magneto-resistive effect element according to claim 2, wherein, when the magneto-resistive effect film forming step is performed at the first time, the magnetic field application angle is set to an angle of 45 degrees with respect to the first direction and the second direction, and wherein, when the magneto-resistive effect film forming step is performed at the second time, the magnetic field application angle is set to an angle obtained by adding +180 degrees to the magnetic field application angle at the time of performing the magneto-resistive effect film forming step at the first time.

9. The method for producing the magneto-resistive effect element according to claim 6, wherein, when the magneto-resistive effect film forming step is performed at the first time, the magnetic field application angle is set to an angle of 45 degrees with respect to the first direction and the second direction, and wherein, when the magneto-resistive effect film forming step is performed at the second time, the magnetic field application angle is set to an angle obtained by adding +180 degrees to the magnetic field application angle at the time of performing the magneto-resistive effect film forming step at the first time.

* * * * *